United States Patent
Kim et al.

(10) Patent No.: US 10,266,407 B2
(45) Date of Patent: Apr. 23, 2019

(54) ELECTRICALLY CONDUCTIVE THIN FILMS

(71) Applicant: SAMSUNG ELECTRONICS CO., LTD., Suwon-si, Gyeonggi-do (KR)

(72) Inventors: Se Yun Kim, Seoul (KR); Sang Il Kim, Seoul (KR); Sung Woo Hwang, Seoul (KR); Yoon Chul Son, Hwaseong-si (KR); Yong-Hee Cho, Seoul (KR); Jae-Young Choi, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 63 days.

(21) Appl. No.: 14/703,237

(22) Filed: May 4, 2015

(65) Prior Publication Data
US 2015/0344306 A1 Dec. 3, 2015

(30) Foreign Application Priority Data
May 27, 2014 (KR) .................. 10-2014-0064005

(51) Int. Cl.
| | | |
|---|---|---|
| C01B 19/00 | (2006.01) |
| H01B 1/06 | (2006.01) |
| C30B 29/46 | (2006.01) |
| C23C 14/06 | (2006.01) |
| C23C 14/28 | (2006.01) |
| H01B 1/00 | (2006.01) |

(52) U.S. Cl.
CPC ........ C01B 19/007 (2013.01); C23C 14/0623 (2013.01); C23C 14/28 (2013.01); C30B 29/46 (2013.01); H01B 1/00 (2013.01); H01B 1/06 (2013.01)

(58) Field of Classification Search
CPC ... C01B 19/007; C23C 14/0623; C23C 14/28; C30B 13/00; C30B 29/46; H01B 1/00; H01B 1/06
See application file for complete search history.

(56) References Cited

U.S. PATENT DOCUMENTS 3,451,845 A 6/1969 Schuler
6,132,568 A 10/2000 Jin et al.
(Continued)

FOREIGN PATENT DOCUMENTS

CN 102822090 A 12/2012
DE 1521326 A1 4/1966
(Continued)

OTHER PUBLICATIONS

Chi et al. (Mater. Res. Soc. Symp. Proc. vol. 1543, published online Aug. 1, 2013).*
(Continued)

*Primary Examiner* — Frank J Vineis
*Assistant Examiner* — Alicia J Sawdon
(74) *Attorney, Agent, or Firm* — Cantor Colburn LLP

(57) ABSTRACT

An electrically conductive thin film including a compound represented by Chemical Formula 1 and having a layered crystal structure $$MeCh_a \qquad \text{Chemical Formula 1}$$

wherein, Me is Y, La, Ce, Pr, Nd, Pm, Sm, Eu, Gd, Tb, Dy, Ho, Er, Tm, Yb, or Lu; Ch is sulfur, selenium, or tellurium; and a is an integer ranging from 1 to 3.

18 Claims, 10 Drawing Sheets

(56) References Cited

U.S. PATENT DOCUMENTS

| | | | |
|---|---|---|---|
| 6,955,940 B2 | 10/2005 | Campbell et al. | |
| 7,531,239 B2 | 5/2009 | Demiryont | |
| 8,933,318 B2 | 1/2015 | Rhyee et al. | |
| 2001/0019037 A1* | 9/2001 | Zakhidov | B82Y 20/00 216/56 |
| 2003/0189403 A1 | 10/2003 | Yamada et al. | |
| 2003/0224168 A1* | 12/2003 | Mack | B82Y 30/00 428/408 |
| 2004/0178414 A1* | 9/2004 | Frey | H01L 51/5206 257/79 |
| 2009/0250651 A1* | 10/2009 | Rhyee | C01B 17/20 252/62.3 T |
| 2011/0240083 A1* | 10/2011 | Rhyee | C01B 19/007 136/238 |
| 2012/0247524 A1* | 10/2012 | Rolison | H01L 35/22 136/203 |
| 2013/0302593 A1* | 11/2013 | Coleman | C01G 35/00 428/323 |

FOREIGN PATENT DOCUMENTS

| | | | | |
|---|---|---|---|---|
| GB | 1061949 A | 3/1967 | | |
| JP | 200483933 A | 3/2004 | | |
| KR | 101064196 | 4/2011 | | |
| KR | 1020110109562 | 10/2011 | | |
| KR | 1020110109562 A | 10/2011 | | |
| WO | WO 2012028724 A1 * | 3/2012 | | C01G 35/00 |
| WO | WO-2012101457 A1 * | 8/2012 | | C01G 39/06 |

OTHER PUBLICATIONS

DiMasi et al. (Physical Review B: vol. 52(20) Chemical pressure and charge-density waves in rare-earth tritellurides, 1995).*
Ru et al. (Physical Review B, 73, 033101) (Year: 2006).*
Bodner Research Web: Transition Metals, accessed Oct. 18, 2017.*
Sinchenko et al. (Physical Review B 85, 241104(R), Sliding charge-density wave in two-dimensional rare-earth tellurides) (Year: 2012).*
Di Masi et al. (Physical Review B 52, 1416-25, Chemical pressure and charge-density waves in rare-earth tritellurides) (Year: 1995).*
A. A. Sinchenko et al. "Unidirectional charge-density-wave sliding in two-dimensional rare-earth tritellurides", Solid State Communications, Pergamon, GB, vol. 188, Mar. 16, 2014 (Mar. 16, 2014), pp. 67-70, XP029020749.
Extended European Search Report dated Jul. 3, 2015, of the corresponding European Patent Application No. 15165655.
E. DiMasi et al. "Chemical pressure and charge-density waves in rare-earth tritellurides", Physical Review B, 1995, vol. 52, No. 20, pp. 14516-14525.
Office Action dated Jul. 21, 2016 for the corresponding European Patent Application No. 15165655.0, 5 pages.
Su (Ike) Chih Chi et al. "A Novel Approach to Synthesize Lanthanum Telluride Thermoelectric Thin Films in Ambient Conditions", Mater. Res. Soc. Symp. Proc., 2013, vol. 1543, 2013, pp. 113-118.
Chinese Office Action dated Jul. 4, 2017, issued for the corresponding Chinese Patent Application No. 201510259510.5 with English Translation.

* cited by examiner

ELECTRICALLY CONDUCTIVE THIN FILMS

CROSS-REFERENCE TO RELATED APPLICATION

This application claims priority to Korean Patent Application No. 10-2014-0064005 filed in the Korean Intellectual Property Office on May 27, 2014, and all the benefits accruing therefrom under 35 U.S.C. § 119, the content of which are incorporated herein in its entirety by reference.

BACKGROUND

1. Field

Electrically conductive thin films and an electronic device including the same are disclosed.

2. Description of the Related Art

A typical electronic device such as a flat panel display, for example, LCD or LED, a touch screen panel, a solar cell, a transparent transistor, and the like includes an electrically conductive thin film or a transparent electrically conductive thin film. A material for an electrically conductive thin film may be desired to have, for example, high light transmittance of greater than or equal to about 80% and low specific resistance of less than or equal to about 100 microohm-centimeters ($\mu\Omega$*cm) in a visible light region. The currently-used material for an electrically conductive thin film includes an oxide material or a conductive polymer material. The oxide material may be indium tin oxide (ITO), tin oxide ($SnO_2$), zinc oxide (ZnO), and the like. The ITO as a transparent electrode material has poor flexibility and inevitably higher costs to produce due to limited availability of indium. Therefore, development of an alternative material is urgently needed. The tin oxide and the zinc oxide show low conductivity and have poor flexibility.

A polymer-based electrode material may be, for example PEDOT:PSS (poly(3,4-ethylenedioxythiophene)poly(styrene sulfonate)). Although the polymer-based electrode material has excellent flexibility, it shows low conductivity and poor stability.

In order to develop a flexible electronic device (such as bendable or foldable electronic device) suitable for use as the next generation electronic device, it is desired to develop a material for a flexible and stable transparent electrode having high transparency and excellent electrical conductivity.

SUMMARY

An embodiment provides a flexible and electrically conductive thin film having high conductivity and excellent light transmittance.

Another embodiment provides an electronic device including the electrically conductive thin film.

In an embodiment, an electrically conductive thin film includes a compound represented by Chemical Formula 1 and having a layered crystal structure:

$$MeCh_a \quad \text{Chemical Formula 1}$$

wherein

Me is Y, La, Ce, Pr, Nd, Pm, Sm, Eu, Gd, Tb, Dy, Ho, Er, Tm, Yb, or Lu;

Ch is sulfur, selenium, or tellurium; and a is an integer ranging from 1 to 3.

The electrically conductive thin film may have transmittance of greater than or equal to about 80 percent (%) for light at a wavelength range of about 550 nanometers at a thickness of 100 nanometers.

The electrically conductive thin film may have higher electrical conductivity in an in-plane direction than electrical conductivity in an out of-plane direction.

The compound may be a tritelluride compound.

The compound may include $YTe_3$, $LaTe_3$, $CeTe_3$, $PrTe_3$, $NdTe_3$, $SmTe_3$, $GdTe_3$, $TbTe_3$, $DyTe_3$, $HoTe_3$, $ErTe_3$, or a combination thereof.

The electrically conductive thin film may include a monocrystal compound.

The electrically conductive thin film may have an electrical conductivity of greater than or equal to about 3,000 Siemens per centimeter.

The compound may have a product of an absorption coefficient ($\alpha$) for light having a wavelength of about 550 nanometers at 25° C. and a resistivity value ($\rho$) thereof of less than or equal to about 30 ohm/square ($\Omega/\square$).

The layered crystal structure may belong to an orthorhombic system with Cmcm(63) space group, an orthorhombic system with a C2 cm(40) space group, or a tetragonal system with a P42/n(86) space group.

The electrically conductive thin film may include a monocrystal of the compound represented by Chemical Formula 1.

The electrically conductive thin film may include a plurality of nanosheets including the compound of Chemical Formula 1, and the nanosheets contact one another to provide an electrical connection.

The electrically conductive thin film may include a continuous deposition film including the compound of Chemical Formula 1.

The electrically conductive thin film may have a thickness of less than or equal to about 100 nanometers.

The electrically conductive thin film may have higher electrical conductivity in an in-plane direction than electrical conductivity in an out-of-plane direction.

Another embodiment provides an electronic device including the above electrically conductive thin film.

The electronic device may be a flat panel display, a touch screen panel, a solar cell, an e-window, an electrochromic mirror, a heat mirror, a transparent transistor, or a flexible display.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
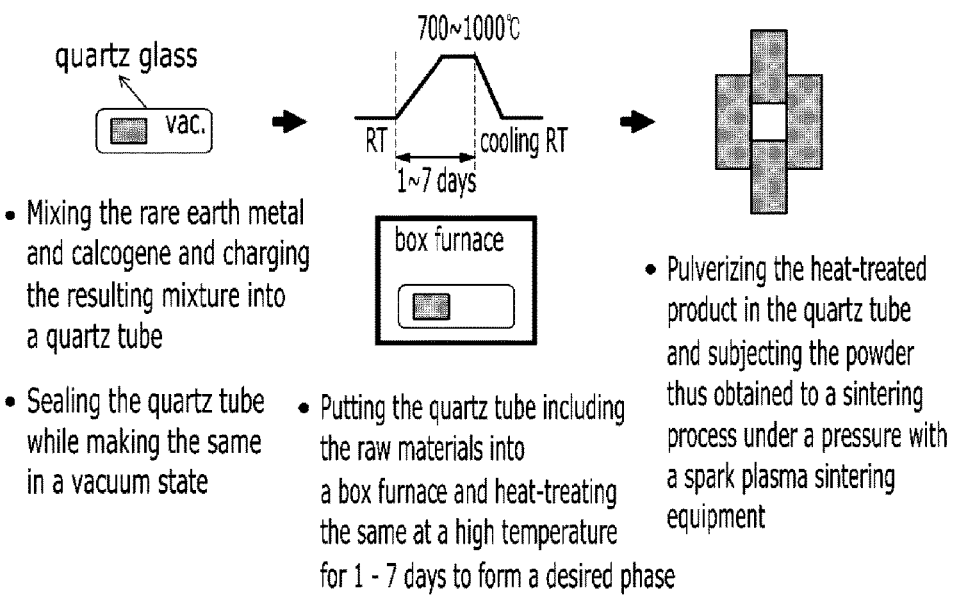
FIG. 1 is a schematic view showing a process of preparing a polycrystalline compound according to an exemplary embodiment.

Advantages and details of this disclosure, and a method for achieving the same, will become apparent referring to the following exemplary embodiments together with the drawings attached hereto. However, this disclosure may be embodied in many different forms and is not be construed as limited to the embodiments set forth herein. Rather, these embodiments are provided with the purpose of satisfying applicable legal requirements. Therefore, in some embodiments, well-known process technologies are not explained in detail in order to avoid vague interpretation of the present inventive concept. Accordingly, the exemplary embodiments are merely described below, by referring to the figures, to explain aspects of the present inventive concept. Expressions such as "at least one of," when preceding a list of elements, modify the entire list of elements and do not modify the individual elements of the list. If not defined otherwise, all terms (including technical and scientific terms) in the specification may be defined as commonly understood by one skilled in the art to which this invention belongs. The terms defined in a generally-used dictionary should be interpreted as having a meaning that is consistent with their meaning in the context of the relevant art and the present disclosure, and may not be interpreted ideally or exaggeratedly unless clearly defined. In addition, unless explicitly described to the contrary, the word "comprise" and variations such as "comprises" or "comprising", and the word "include" and variations such as "includes" or "including", when used in this specification, specify the presence of stated features, regions, integers, steps, operations, elements, and/or components, but do not preclude the presence or addition of one or more other features, regions, integers, steps, operations, elements, components, and/or groups thereof. Therefore, the above words will be understood to imply the inclusion of stated elements but not the exclusion of any other elements.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As stated above, the singular includes the plural unless mentioned otherwise.

In the drawings, the thickness of layers, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In an embodiment, an electrically conductive thin film includes a compound represented by the following Chemical Formula 1 and having a layered crystal structure:

$$MeCh_a \qquad \text{Chemical Formula 1}$$

wherein in Chemical Formula 1,

Me is Y, La, Ce, Pr, Nd, Pm, Sm, Eu, Gd, Tb, Dy, Ho, Er, Tm, Yb, or Lu;

Ch is sulfur, selenium, or tellurium;

and a is an integer of 1 to 3, for example, 1, 2, or 3.

The electrically conductive thin film may have transmittance of greater than or equal to about 80 percent (%), for example greater than or equal to about 85%, or greater than or equal to about 90% for light at a wavelength ranging of about 550 nanometers (nm) at a thickness of 100 nm.

The compound may include $YTe_3$, $LaTe_3$, $CeTe_3$, $PrTe_3$, $NdTe_3$, $SmTe_3$, $GdTe_3$, $TbTe_3$, $DyTe_3$, $HoTe_3$, $ErTe_3$, or a combination thereof. The electrically conductive thin film may include a monocrystal or polycrystal compound.

Figure 2:
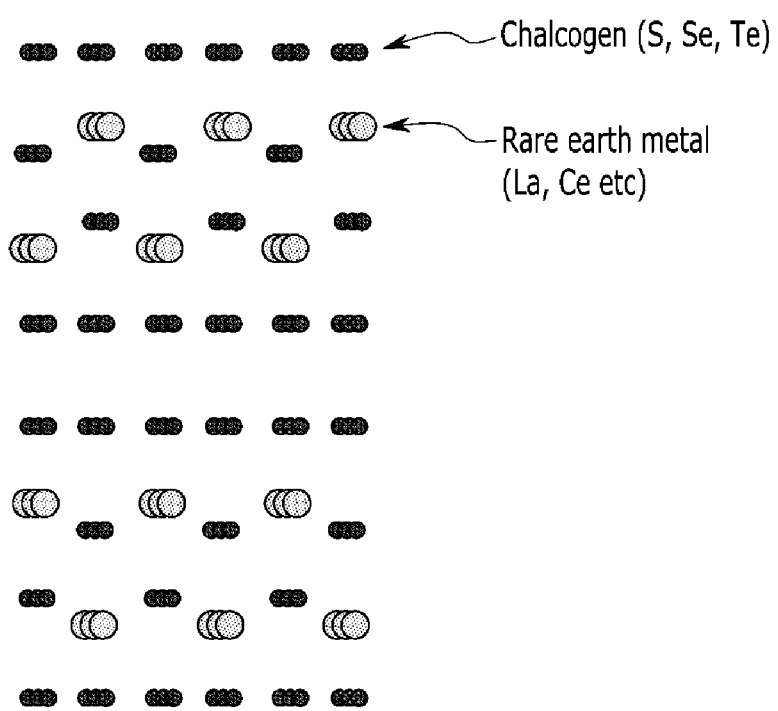
FIG. 2 is a schematic view showing a structure of a unit structure layer of a compound according to an embodiment.
Figure 3:
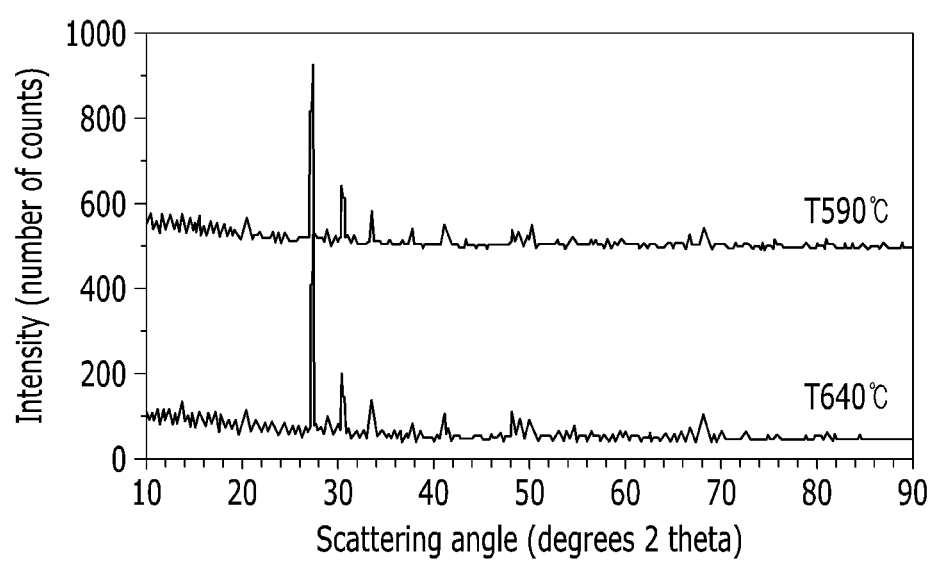
FIG. 3 is a graph of intensity (number of counts) versus scattering angle (degrees 2 theta), which is an X-ray diffraction spectrum of a $CeTe_3$ polycrystal sintered body.
Figure 4:
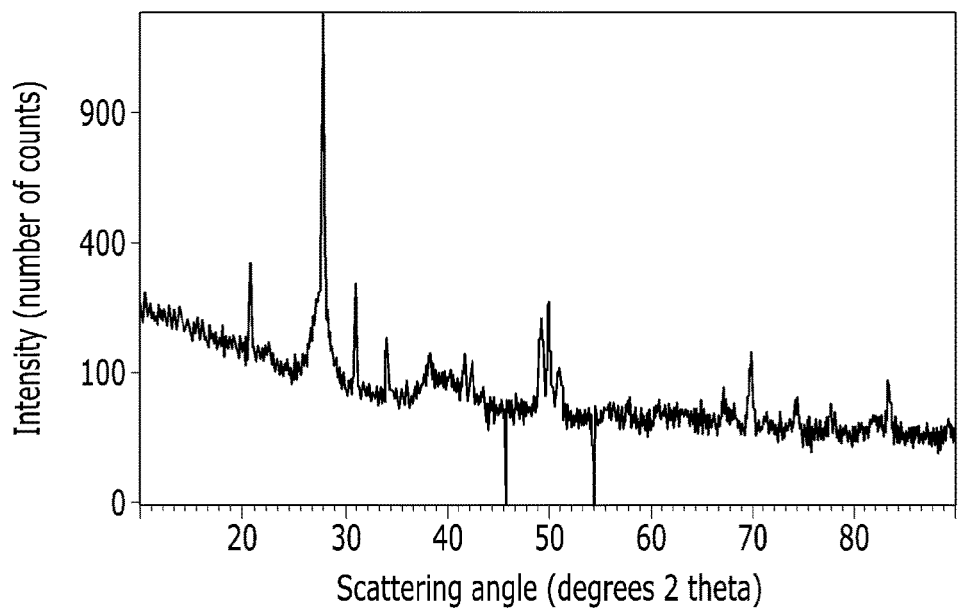
FIG. 4 is a graph of intensity (number of counts) versus scattering angle (degrees 2 theta), which is an X-ray diffraction spectrum of a $YTe_3$ polycrystal sintered body.
Figure 5:
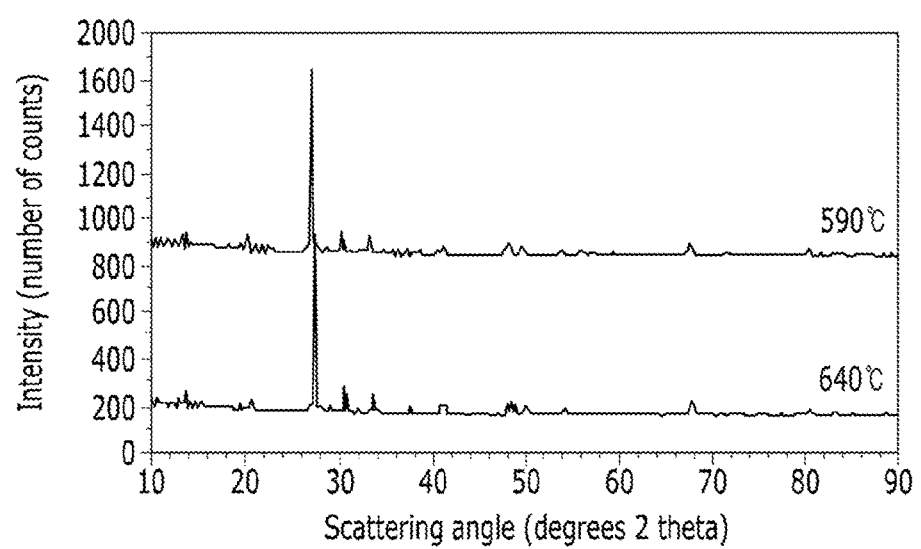
FIG. 5 is a graph of intensity (number of counts) versus scattering angle (degrees 2 theta), which is an X-ray diffraction spectrum of a $LaTe_3$ polycrystal sintered body.
Figure 6:
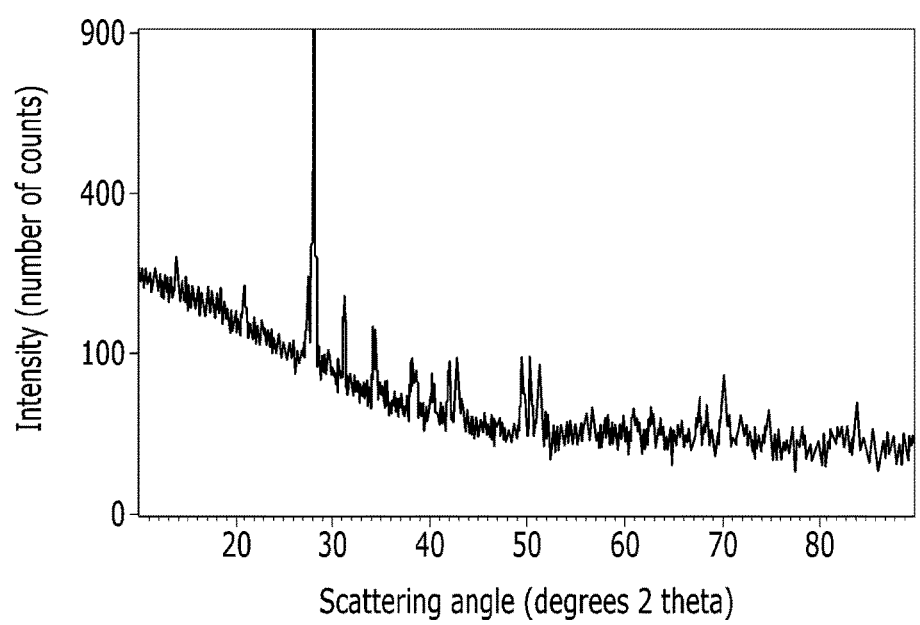
FIG. 6 is a graph of intensity (number of counts) versus scattering angle (degrees 2 theta), which is an X-ray diffraction spectrum of an ErTe$_3$ polycrystal sintered body.
Figure 7:
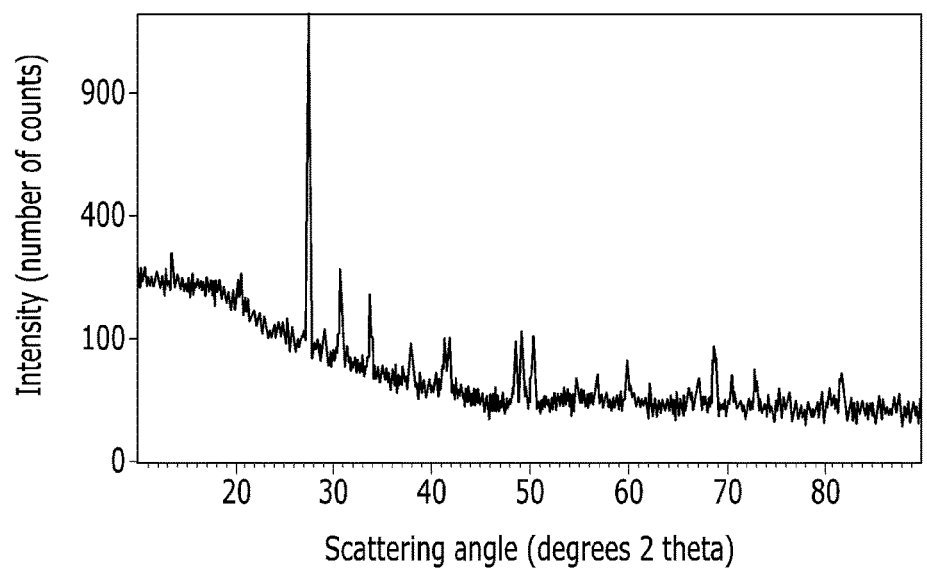
FIG. 7 is a graph of intensity (number of counts) versus scattering angle (degrees 2 theta), which is an X-ray diffraction spectrum of a NdTe$_3$ polycrystal sintered body.
Figure 8:
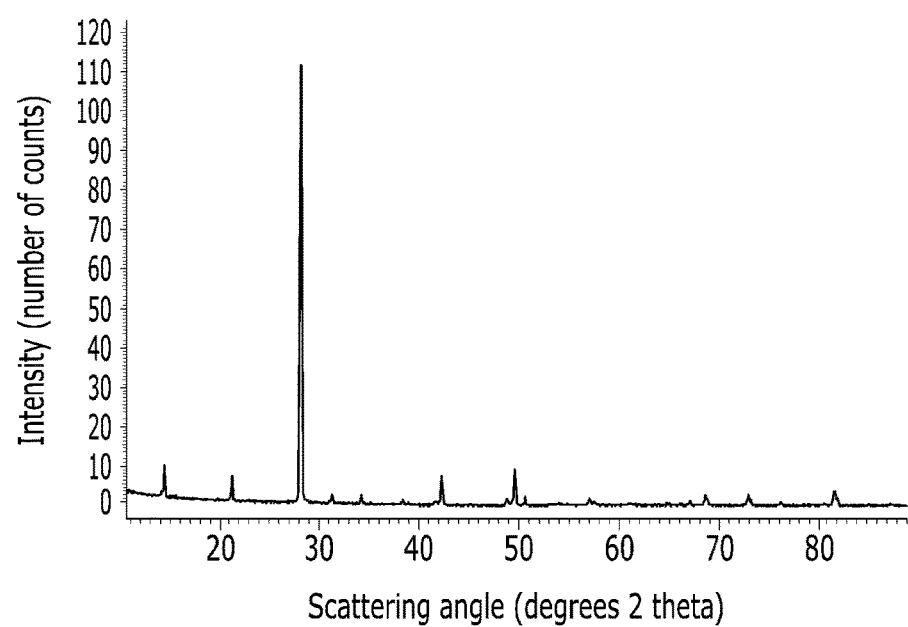
FIG. 8 is a graph of intensity (number of counts) versus scattering angle (degrees 2 theta), which is an X-ray diffraction spectrum of a SmTe$_3$ polycrystal sintered body.

The rare earth metal chalcogenide compound represented by Chemical Formula 1 has a layered crystal structure, and may provide an electrically conductive thin film having excellent conductivity, flexibility, and transparency. The electrically conductive thin film may be fabricated into one continuous film (e.g., as a deposition film or coating layer) or into a layer including nanoflakes obtained by exfoliation. In the layer, at least some of the nanoflakes contact each other so as to provide an electrical connection. Referring to FIG. 2, in a crystal structure of a rare earth element chalcogenide according to an embodiment, the chalcogen atom is present on the uppermost part and lower part of the unit structure layer, and each of the unit structure layers is bonded by van der Waals force. The binding energy of van der Waals force is less than that of a covalent bond or an ionic bond. For example, the compound of Chemical Formula 1 has a binding force between layers of less than or equal to about $1.24 \times 10^{-3}$ electron volts per angstrom (eV/A). Accordingly, the unit structure layers may be relatively easily exfoliated due to the weak bonding therebetween to provide nanosheets (or nanoflakes). The exfoliated nanosheets are coated on a substrate to provide, for example, a thin film (e.g., a monolayer) in which each nanosheet contacts other nanosheets, and the thin film may have excellent flexibility together with high conductivity and transparency.

The electrically conductive thin film may have conductivity of greater than or equal to about 3,000 Siemens per centimeter (S/cm), for example, greater than or equal to about 3,500 S/cm, greater than or equal to about 4,000 S/cm, greater than or equal to about 5,000 S/cm, greater than or equal to about 6,000 S/cm, or greater than or equal to about 7,000 S/cm. In some embodiments, an electrically conductive thin film including a rare earth metal tritelluride compound may have high conductivity of about 3,000 to about 10,000 S/cm. The conductivity may further increase (e.g., by about 2 to 3 times) when measured in a single crystal in-plane direction. In addition, the electrically conductive thin film may have electrical conductivity measured in the in-plane direction that is higher than that in the out-of-plane direction.

Various research efforts have been undertaken to develop a flexible transparent electrode material having high electrical conductivity and transparency in the visible ray region. Metal electrode materials may have high electron density and high electrical conductivity. However, a metal thin film tends to react with oxygen in air to provide a surface oxide. As a result, some metals may suffer serious oxidation, showing increased contact resistance. There has been an attempt to decrease the surface contact resistance by using a ceramic material having good conductivity and showing decreased surface oxidation. However, the currently available conductive ceramic materials (e.g., ITO) have unstable supply of their raw precursor materials, and have difficulty in achieving conductivity as high as the conductivity of metal. In addition, the conductive ceramic materials generally show poor flexibility. On the contrary, the electrically conductive thin films including the rare earth chalcogenide according to the embodiment have electrical conductivity as high as the electrical conductivity of a metal, and also display high transparency and excellent flexibility. Therefore, these electrically conductive thin films may be advantageously utilized in a flexible electronic device.

For the rare earth chalcogenide compound of the electrically conductive thin film, the product of its absorption coefficient ($\alpha$) with respect to light of a wavelength of about 550 nm and the resistivity ($\rho$) thereof ($\alpha \times \rho$) may be less than or equal to about 30 ohm/square ($\Omega/\square$), for example, less than or equal to about 26 $\Omega$/square. Herein, the absorption coefficient and the resistivity are obtained from a computer simulation. The resistivity ($\rho$) is obtained by calculating the density of state (DOS) and the band structure around the Fermi level from the crystal structure of the corresponding rare earth element chalcogenide compounds. In addition, the absorption coefficient ($\alpha$) for a certain wavelength is calculated from the dielectric constant of the compound that is obtained by applying the Drude model and considering electron transition due to interband transition. As to simulation methodology for providing the absorption coefficient ($\alpha$) and the resistivity ($\rho$), it is possible to further refer to Vienna Ab-initio Simulation Package (written by Georg Kresse and Jurgen Furthmuller, Institut fur Materialphysik, Universitat Wien, Sensengasse 8, A-1130 Wien, Austria, Aug. 24, 2005), which is incorporated herein by reference in its entirety. The aforementioned simulation procedures can be summarized as in Table 1.

TABLE 1

| Calculation | Simulation level | Calculation/simulation |
|---|---|---|
| Atom electron structure | DFT | Structure optimization Band structure calculation |
| Conductive characteristic | Semi-classical Boltzmann transport (const. $\tau$) | Intraband transition $\sigma \approx (e^2/4\pi^3) \tau \int dk\ v(k)\ v(k)$ $(-\partial f/\partial \varepsilon) =$ $ne^2 \tau/m_{eff} = ne\ \mu$ $\rho = 1/\sigma$ |
| Dielectric characteristic | DFPT + Drude model | Interband transition $\varepsilon(\omega) = \varepsilon_D(\omega) + \varepsilon_B(\omega) =$ $\varepsilon_1(\omega) + i\ \varepsilon_2(\omega)$ |
| Optical characteristic | Ray optics | $n(\omega) + i\ k(\omega) = \varepsilon\ (\omega)^{1/2}$ Absorption coeff. $\alpha = 4\pi k/\lambda$ Calculate $\rho\alpha$ | wherein in Table 1,

DFT: density-functional theory

DFPT: density-functional perturbation theory

Drude model: free electron model for solid $\sigma$, $\tau$, $m_{eff}$, $\mu$, $\rho$: electrical conductivity, relaxation time, effective mass, mobility, resistivity Hereinbelow, the description of Table 1 is explained in detail.

In order to calculate a quantum mechanical state of a material, the first-principles calculation (a calculation made from a fundamental equation without using extrinsic parameter) based on the density-functional-theory (DFT) method (a method of solving a quantum mechanical equation by describing the electron distribution using an electron density function instead of a wave function) is performed to calculate the quantum mechanical state of the electron. The electron state is calculated using the VASP (the Vienna Ab initio simulation package code, which is the first principle DFT code). A candidate material group including a two-dimensional electron gas layer is selected from the Inorganic Crystal Structure Database (ICSD). The atomic structure information for the material is input and the energy level of the electrons is calculated by simulation and for such electrons, an energy density function and a state density function on a k-space of the electrons are calculated.

The electron structure calculated through the DFT simulation provides an E-k diagram (band structure) and a DOS (Density of State: electron state density, electron state density function per energy unit) information, making it possible to determine whether the given material is a metallic conductive material (DOS(E)>0) or a semi-conductor material (DOS(E)=0) depending on the presence of the DOS on the maximum energy level (E) available to the electrons. In order to predict the conductivity (σ) of a metallic conducting material, its conductive characteristics are estimated by introducing a semi-classical Boltzmann transport model. In this case, relaxation time of electrons (τ: duration during which an electron can move without collision) is supposed to be constant (see, Ashcroft and Mermin, Solid State Physics).

$$\sigma = (e^2/4\pi^3)\tau \int dk v(k)v(k)(-\partial f/\partial E)$$

wherein in the above equation,
τ is a relaxation time of an electron;
k is a state of the electron at the k-space;
v(k) is a speed of the electron at the k state;
f is the Fermi-Dirac distribution function; and
E is energy.

In this case, v(k) may be calculated from the E-k diagram. σ/τ may be obtained from the above formula.

Calculation of Transmittance Using DFPT+Drude Model

The mechanism determining the transmittance or absorption of the conductive material may include intraband absorption due to plasma-like oscillation of free electrons and interband absorption due to band-to-band transition of bound electrons. The quantum computational simulation process considering each of the mechanisms may be obtained by the process as set forth in Table 2 named "Simulation Table for Optical Properties" (see, Ashcroft and Mermin. Solid State Physics).

TABLE 2

| STEP | Category | Calculation | Results | Method (tool) |
|---|---|---|---|---|
| 8 | Optical simulation | Interband transition | εB(w) = εB1(w) + i εB2(w) | DFT (VASP) |
| 9 | Optical simulation | Plasma frequency Intraband transition | εD(w) = εD1(w) + i εD2(w) | Boltzmann transport DFT (VASP) or Post-processing |
| 10 | Optical simulation | Total dielectric constant Refractive index | | Post-processing |
| 11 | Optical simulation | Reflectance Absorption coefficient | Plasma freq. Reflectance Absorption co. Transmittance | Post-processing | wherein in Table 2,
B denotes a band, and
D denotes a Drude model.

In this case, the relationships of the dielectric constant (ε), the refractive index (n), and the absorption coefficient (α) of a solid is shown as follows. For the dielectric constant, both the interband transition related portion (ε) and the intraband transition related portion (ε) should be considered.

$$\varepsilon(\omega) = \varepsilon_{(Drude)} + \varepsilon_{(Band)} = \varepsilon_1(\omega) + i\varepsilon_2(\omega) \quad \text{dielectric function}$$

$$(n + ik)^2 = \varepsilon(\omega) \quad \text{refraction function}$$

$$\alpha(\omega) = 4\pi k/\lambda \quad \text{absorption coefficient}$$

As set forth in the above conductivity calculation, the interband absorption may be calculated through the band structure as calculated in advance while the intraband absorption by the free electrons is calculated by the simulation as below through the conductivity and optical coefficient calculation based on the Drude modeling (see, Jinwoong Kim, Journal of Applied Physics 110, 083501 2011).

CGS UNIT $$\sigma(\omega) = \sigma_0/[1 - i\omega\tau] \quad \text{AC conductivity}$$

$$\sigma_0 = ne^2\tau/m \quad \text{DC conductivity}$$

$$\varepsilon(\omega) = 1 + i(4\pi/\omega)\sigma(\omega)$$

$$\omega_p^2 \tau = \sigma_0/\varepsilon_0 \quad (si)$$
$$= 4\pi \sigma_0 \quad (cgs)$$

$$\varepsilon(\omega) = 1 + i(4\pi/\omega)\sigma_0/[1 - i\omega\tau] = 1 - (4\pi \sigma_0/\omega)/[i + \omega\tau]$$
$$= 1 - (4\pi \sigma_0/\omega)(-i + \omega\tau)/[1 + (\omega\tau)^2]$$
$$= 1 - (\omega_p\tau)^2/[1 + (\omega\tau)^2] + i(\omega_p\tau)^2/[\omega\tau(1 + (\omega\tau)^2)]$$

$$\epsilon_1 = 1 - \frac{\omega_p^2 \tau^2}{1 + \omega^2 \tau^2} \quad n = \frac{1}{\sqrt{2}}\left(\epsilon_1 + (\epsilon_1^2 + \epsilon_2^2)^{1/2}\right)^{1/2}$$

$$\epsilon_2 = \frac{\omega_p^2 \tau^2}{\tau\omega(1 + \omega^2 \tau^2)} \quad \kappa = \frac{1}{\sqrt{2}}\left(-\epsilon_1 + (\epsilon_1^2 + \epsilon_2^2)^{1/2}\right)^{1/2}$$

ω: frequency
$\omega_p$: plasma frequency
k: extinction coefficient

As set forth in the above, the calculation of the interband absorption and the intraband absorption makes it possible to calculate the dielectric function of the given material, and the optical constants thereof can be simulated therefrom. In the end, the reflectance (R), the absorption coefficient (α), and the transmittance (T) of the given material can be calculated therefrom.

The absorption coefficient (α) and the resistivity (ρ) of the various rare earth chalcogenides are obtained according to the method, and the results are shown in Table 3.

TABLE 3

| Composition | Resistivity (ρ) (Ω * cm) | Absorption coefficient (α) (1/cm) | ρ × α (Ω/□) | Transparent electrode sheet resistance $R_s$ (Ω/sq, transparency 90%) |
|---|---|---|---|---|
| YTe₃ | 1.01 × 10⁻⁵ | 2.7 × 10⁵ | 2.73 | 25.8 |
| LaTe₃ | 1.11 × 10⁻⁵ | 2.3 × 10⁵ | 2.55 | 24.7 |
| CeTe₃ | 1.08 × 10⁻⁵ | 2.2 × 10⁵ | 2.38 | 22.5 |

The product of resistivity (ρ) and absorption coefficient (α) may represent the product of sheet resistance ($R_s$) and transmittance (−ln T) according to the Equation. Accordingly, the compound having a lower value of ρ*α may be advantageous for a material of the electrically conductive thin film.

$$e^{-\alpha t} = T \quad (i.e., \alpha t = -\ln T)$$

$$R_s = \rho/t$$

$$\therefore \rho^*\alpha = R_s^*(-\ln T)$$

α: absorption coefficient
ρ: resistivity
T: transmittance (at λ=550 nm)
t: thickness
Rs: sheet resistance The compound included in the electrically conductive thin film according to the embodiment may have a product of the absorption coefficient and the resistivity (i.e., $R_s*(-\ln T)$) of less than or equal to about 30, for example, less than or equal to about 26, less than or equal to about 25, or less than or equal to about 20, so as to provide an electrically conductive thin film having high conductivity and excellent transparency (i.e., low sheet resistance and high light transmittance).

The electrically conductive thin films according to the embodiments include an inorganic material including a metal and a non-metal element, but may have very high conductivity even at a low thickness. Without being bound by any particular theory, it is believed that the aforementioned electrically conductive thin films may exhibit very high conductivity with high transparency as they include electrons that are two-dimensionally confined in the layered crystal structure, and the electrons may be moved with high mobility even at a low thickness.

In addition, the electrically conductive thin film including the compound having a layered crystal structure may undergo an interlayer sliding to provide high flexibility. According to an embodiment, the layered crystal structure of a rare earth chalcogenide compound represented by Chemical Formula 1 may include an orthorhombic system or a tetragonal system, and may belong to a space group as set forth in Table 4.

TABLE 4

| Composition | Space group |
|---|---|
| $YTe_3$ | Cmcm 63 |
| $LaTe_3$ | Cmcm 63 |
| $CeTe_3$ | Cmcm 63 |
| $PrTe_3$ | C2cm 40 |
| $NdTe_3$ | Cmcm 63 |
| $SmTe_3$ | C2cm 40 |
| $GdTe_3$ | C2cm 40 |
| $TbTe_3$ | P42/n 86 |
| $DyTe_3$ | P42/n 86 |
| $HoTe_3$ | Cmcm 63 |
| $ErTe_3$ | Cmcm 63 |

According to an embodiment, the electrically conductive thin film may be produced by preparing a raw material of a rare earth metal chalcogenide compound represented by Chemical Formula 1, a polycrystalline or monocrystalline bulk material prepared from the same, or a powder obtained from the bulk material, and conducting a proper method such as vapor deposition and the like with the raw material powder, the prepared bulk material, or a powder thereof to form a conductive thin film (e.g., a transparent conductive layer). Alternatively, the electrically conductive thin film may be obtained by liquid phase exfoliation of the bulk material powder to provide nanosheets and forming the obtained nanosheets into a thin film.

The raw material of the rare earth metal chalcogenide compound may include each element and a compound including the element. For example, the raw material may include Y, La, Ce, Pr, Nd, Pm, Sm, Eu, Gd, Tb, Dy, Ho, Er, Tm, Yb, or Lu. Also, for example, the raw material may be sulfur, selenium, or tellurium. According to an embodiment, the raw material may be a compound of the above metal and sulfur, selenium, or tellurium.

The polycrystalline bulk material may be prepared from the above raw material according to a quartz ampoule method, an arc melting method, a solid-state reaction method, and the like. For example, the quartz ampoule method includes introducing the raw material into a quartz tube or an ampoule made of a metal, sealing the same under vacuum, and heating the same to perform a solid-phase reaction or a melting process. The arc melting method includes introducing a raw material element into a chamber, performing an arc discharge process under an inert gas (e.g., nitrogen, argon, etc.) atmosphere to melt the raw material element, and solidifying the same. The solid-state reaction method may include mixing and pelletizing the raw material powder and heat-treating the obtained pellet. In some embodiments, the solid-state reaction method may include heat-treating the obtained mixture and pelletizing and sintering the same.

The obtained polycrystalline bulk material may be subjected to a sintering process to prepare a highly densified product. The highly densified product may be used as a specimen for measuring electrical conductivity. Such a densification process may be performed by a hot pressing method, a spark plasma sintering method, a hot forging method, or the like. The hot pressing method includes applying the pulverized compound into a mold having a predetermined shape, and forming the same at a high temperature of, for example, about 300° C. to about 800° C. under a high pressure of, for example, about 1 megaPascals (MPa) (e.g., 30 MPa) to about 300 megaPascals (MPa). The spark plasma sintering method includes applying the pulverized compound with high voltage current under a high pressure, for example, with a current of about 50 Amperes (A) to about 500 A under a pressure of about 30 MPa to about 300 MPa to sinter the material within a short period of time. The hot forging method may include compressing and sintering the powder compound at a high temperature of, for example, about 300° C. to about 700° C.

The monocrystalline material may be obtained by preparation of a crystal ingot or a growth of a monocrystal. The crystal ingot may be obtained by heating a congruent melting material to a temperature higher than the melting point of the material and then slowly cooling the same. For example, the raw material mixture is introduced into a quartz ampoule, melted after sealing the ampoule under vacuum, and the melted mixture is slowly cooled to provide a crystal ingot. The crystal grain size may be controlled by adjusting the cooling speed of the melted mixture. The growth of the monocrystal may be performed by a metal flux method, a Bridgman method, an optical floating zone method, a vapor transport method, or the like. The metal flux method is a method including melting the raw material powder in a crucible together with additional flux at a high temperature and slowly cooling the same to grow crystals at a predetermined temperature. The Bridgman method includes introducing the raw material element into a crucible and heating the same at a high temperature until the raw material element is dissolved at the terminal end of the crucible, and then slowly moving the high temperature zone and locally dissolving the sample to pass the entire sample through the high temperature zone, so as to grow a crystal. The optical floating zone method is a method including forming a raw material element into a rod-shaped seed rod and a feed rod, locally melting the sample at a high temperature by focusing lamp light on the feed rod, and slowly pulling up the melted part to grow a crystal. The vapor transport method includes introducing the raw material element into the bottom part of a quartz tube and heating the raw material element, and maintaining the upper part of quartz tube at a low temperature to perform a solid-phase reaction with a vaporized raw material element at a low temperature and thereby to grow a crystal. The electrical conductivity of the obtained monocrystal material may be measured according to a DC 4-terminal method.

The obtained polycrystal or monocrystal bulk material is pulverized to provide crystal powders. The pulverization may be performed by any methods such as a ball mill without particular limitation. After the pulverization, the powder having a uniform size may be provided using, for example, a sieve.

The obtained polycrystal or monocrystal bulk material is used as a target or the like of vapor deposition to provide a thin continuous film (i.e., electrically conductive thin film) including the compound. The vapor deposition may be performed by a physical vapor deposition such as a thermal evaporation and sputtering, chemical vapor deposition (CVD), atomic layer deposition (ALD), or pulsed laser deposition. The deposition may be performed using any known or commercially available apparatus. The deposition condition may vary with the types of the compound and the deposition method, but are not particularly limited.

According to another embodiment, the bulk material of the above compound or the powder thereof may be subjected to liquid phase exfoliation to obtain a plurality of nanosheets, which are then brought into contact with each other so as to provide an electrical connection, providing an electrically conductive thin film.

In the liquid phase exfoliation, the bulk material or the powder thereof may be subjected to ultra-sonication in an appropriate solvent. Examples of the solvent suitable for the liquid phase exfoliation may include, but are not limited to, water, alcohol (isopropyl alcohol, ethanol, or methanol), N-methyl pyrrolidone (NMP), hexane, benzene, dichlorobenzene, toluene, chloroform, diethyl ether, dichloromethane (DCM), tetrahydrofuran (THF), ethyl acetate (EtOAc), acetone, dimethyl formamide (DMF), acetonitrile (MeCN), dimethyl sulfoxide (DMSO), ethylene carbonate, propylene carbonate, γ-butyrolactone, γ-valerolactone, a perfluorinated aromatic solvent (e.g., hexafluorobenzene, octafluorotoluene, pentafluorobenzonitrile, and pentafluoropyridine), or a combination thereof.

The solvent may further include an additive such as a surfactant in order to facilitate the exfoliation and prevent the exfoliated nanosheets from being agglomerated. Examples of the surfactant may include sodium dodecyl sulfate (SDS) and sodium dodecyl benzenesulfonate (SDBS).

The ultrasonication may be performed by using any conventional or commercially available ultrasonication device, and the conditions thereof (e.g., ultrasonication time) are not particularly limited, but may be appropriately selected considering a solvent used and a powder concentration in the solvent. For example, the ultrasonication may be performed for greater than or equal to about 1 hour, for example, for about 1 hour to about 100 hours, but is not limited thereto. The powder concentration in the solvent may be greater than or equal to about 0.01 grams per milliliter (g/ml), for example, within a range from about 0.01 g/ml to about 1 gram per liter (g/l), but is not limited thereto.

In order to promote the exfoliation, lithium atoms may be intercalated into the compound having a layered crystal structure. According to an embodiment, the compound is immersed in an alkyllithium compound (e.g., butyllithium) solution in an aliphatic hydrocarbon solvent such as hexane to intercalate lithium atoms into the compound, and the obtained product is subjected to ultrasonication to provide a plurality of nanosheets including the compound. For example, by placing the obtained product in water, water and the intercalated lithium ion may react to generate hydrogen between layers of the crystal structure, so as to accelerate the interlayer separation. The obtained nanosheets are separated according to an appropriate method (e.g., centrifugation) and washed.

In the electrically conductive thin film including the nanosheets (e.g., nanoflakes), the nanosheets physically contact one another to provide an electrical connection. The length of nanosheets is not particularly limited, but may be appropriately adjusted. For example, the nanosheet may have a length of less than or equal to about 500 micrometers (μm), for example, of about 10 nm to about 10 μm, but is not limited thereto. The nanosheets may have a thickness of less than or equal to about 100 nm. When the nanosheets are physically connected to provide a thinner film, the film thus prepared may exhibit more improved transmittance. The obtained film may have coverage of greater than or equal to about 20%, for example, of greater than or equal to about 50%. The obtained film may have high transmittance (e.g., greater than or equal to about 80%, or greater than or equal to about 85%) when the thickness is less than or equal to about 100 nm, for example, less than or equal to about 5 nm. The film using a nanosheet may be manufactured by any conventional method. For example, the formation of the film may be performed by dip coating, spray coating, printing after forming an ink or a paste, and the like.

According to an embodiment, the manufactured nanosheets are added to deionized water, and the resultant dispersion is ultrasonicated again. An organic solvent that is not miscible with water (e.g., an aromatic hydrocarbon such as xylene or toluene) is added to the ultrasonicated dispersion. When the mixture thus obtained is shaken, a thin film including nanosheets is formed at the interface between the water and the organic solvent. When a clean, wetted, and oxygen plasma-treated glass substrate is slightly dipped to the interface and taken out, the thin film including nanosheets is spread out on the substrate at the interface. The thickness of the thin film may be adjusted by controlling a concentration of the nanosheets per area on the surface of the water/organic solvent and a speed/angle when the substrate is taken out.

The electrically conductive thin film shows high conductivity, enhanced light transmittance, and excellent flexibility, and thus may replace an electrode including a transparent conductive oxide such as ITO, ZnO, and the like and a transparent film including a Ag nanowire.

Another embodiment provides an electronic device including the above electrically conductive thin film. The electrically conductive thin film is the same as described above. The electronic device may include, for example, a flat panel display (e.g., LCD, LED, and OLED), a touch screen panel, a solar cell, an e-window, a heat mirror, a transparent transistor, or a flexible display, but is not limited thereto.

Figure 10:
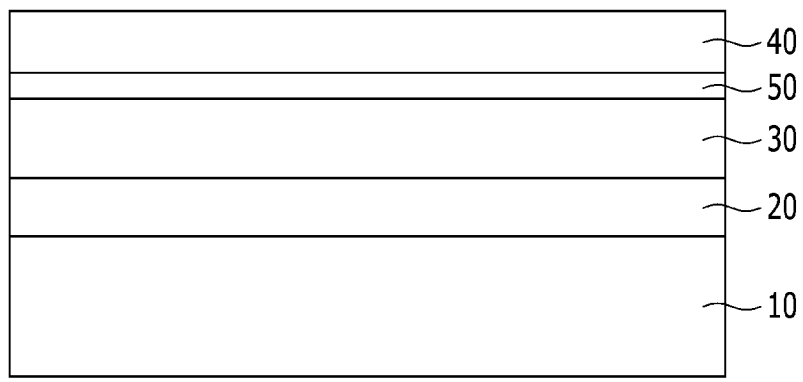
FIG. 10 is a cross-sectional view of an organic light emitting diode device including an electrically conductive thin film according to an embodiment.

FIG. 10 is a cross-sectional view of an organic light emitting diode device including an electrically conductive thin film according to an embodiment.

An organic light emitting diode device according to an embodiment includes a substrate 10, a lower electrode 20, an upper electrode 40 facing the lower electrode 20, and an emission layer 30 interposed between the lower electrode 20 and the upper electrode 40.

The substrate 10 may be made of an inorganic material such as glass, or an organic material such as polycarbonate, polymethyl methacrylate, polyethylene terephthalate, polyethylene naphthalate, polyamide, polyethersulfone, or a combination thereof, or a silicon wafer.

One of the lower electrode 20 and the upper electrode 40 is a cathode and the other is an anode. For example, the lower electrode 20 may be an anode and the upper electrode 40 may be a cathode.

At least one of the lower electrode 20 and the upper electrode 40 may be a transparent electrode. When the lower electrode 20 is a transparent electrode, the organic light emitting diode device may have a bottom emission structure in which light is emitted toward the substrate 10, while when the upper electrode 40 is a transparent electrode, the organic light emitting diode device may have a top emission structure in which light is emitted away from the substrate 10. In addition, when the lower electrode 20 and upper electrode 40 are both transparent electrodes, light may be emitted toward the substrate 10 and away from the substrate 10.

The transparent electrode may include the above electrically conductive thin film. The electrically conductive thin film is the same as described above. The electrically conductive thin film may have high electron density. By using the electrically conductive thin film, the conventional LiF/Al or MgAg alloy may be substituted to a single material.

The emission layer 30 may be made of an organic material inherently emitting one among three primary colors such as red, green, blue, and the like, or a mixture of an inorganic material with the organic material, for example, a polyfluorene derivative, a (poly)paraphenylene vinylene derivative, a polyphenylene derivative, a polyvinylcarbazole, a polythiophene derivative, or a compound prepared by doping these polymer materials with a perylene-based pigment, a coumarin-based pigment, a rothermine-based pigment, rubrene, perylene, 9,10-diphenylanthracene, tetraphenylbutadiene, Nile red, coumarin, quinacridone, and the like. An organic light emitting device displays a desirable image by a special combination of primary colors emitted by an emission layer therein.

The emission layer 30 may emit white light by combining basic colors such as three primary colors of red, green, and blue, and in this case, the color combination may emit white light by combining the colors of adjacent pixels or by combining colors laminated in a perpendicular direction.

An auxiliary layer 50 may be positioned between the emission layer 30 and the upper electrode 40 to improve luminous efficiency of the emission layer 30. In the drawing, the auxiliary layer 50 is shown only between the emission layer 30 and the upper electrode 40, but it is not limited thereto. The auxiliary layer 50 may be positioned between the emission layer 30 and the lower electrode 20, or between the emission layer 30 and the upper electrode 40 and between the emission layer 30 and the lower electrode 20.

The auxiliary layer 50 may include an electron transport layer (ETL) and a hole transport layer (HTL) for achieving a balance between electrons and holes, an electron injection layer (EIL) and a hole injection layer (HIL) for reinforcing injection of electrons and holes, and the like. It may include one or more layers selected therefrom.

In addition, an example of applying the electrically conductive thin film to an organic light emitting diode device is illustrated, but the electrically conductive thin film may be used as an electrode for all electronic devices including a transparent electrode without a particular limit, for example, a pixel electrode and/or a common electrode for a liquid crystal display (LCD), an anode and/or a cathode for an organic light emitting diode device, a display electrode for a plasma display device, and a transparent electrode for a touch panel device.

Hereinafter, the embodiments are illustrated in more detail with reference to examples. These examples, however, are not to be interpreted as limiting the scope of this disclosure.

EXAMPLES

Example 1: Preparation of Polycrystalline Sintered Body

A polycrystal sintered body is prepared according to the following method, as shown in FIG. 1.

0.01 mole (mol) of a rare earth element (purity: 99.9%, manufacturer: Sigma Aldrich) and 0.03 mol of elemental tellurium (purity: 99.99%, manufacturer: Sigma Aldrich) are mixed in a glove box to provide a mixture. The prepared mixture is introduced into a quartz glass tube, and the tube is sealed under a vacuum condition. The quartz glass tube is introduced into a box furnace and heated to 700° C. to 1,000° C. (e.g., a temperature of 700° C., 750° C., 800° C., 850° C., 900° C., 950° C., or 1000° C.) at a heating rate of 100 degrees Centigrade per hour (° C./h), maintained at the same temperature for 4 days, and is slowly cooled to room temperature (performing a solid-state method).

The obtained sample is pulverized and is subjected to a spark-plasma sintering (SPS) process using a SPS equipment (manufactured by Fuji Electronic Industrial Co., Ltd. Model name: Dr. Sinter) at a temperature of 500 to 900° C. under a pressure 40 to 80 MPa.

For the obtained sintered body, electrical conductivity is measured using ULVAC-Riko ZEM-3 equipment according to the DC 4 terminal method under the conditions of room temperature/normal pressure, and the results are presented in Table 5.

For some of the obtained calcinated bodies, X-ray diffraction analysis is made and the results thereof are shown in FIG. 3 to FIG. 8. From the results of FIG. 3 to FIG. 8, it is confirmed that a single phase of a rare earth element tritelluride compound having a layered crystal structure is synthesized.

TABLE 5

| Composition | σ (S/cm) |
| --- | --- |
| $YTe_3$ | 9,851 |
| $LaTe_3$ | 3,546 |
| $CeTe_3$ | 7,298 |
| $PrTe_3$ | 6,690 |
| $NdTe_3$ | 6,804 |
| $SmTe_3$ | 9,180 |
| $GdTe_3$ | 7,317 |
| $TbTe_3$ | 3,500 |
| $DyTe_3$ | 8,447 |
| $HoTe_3$ | 8,420 |
| $ErTe_3$ | 9,801 |

From the results of Table 5, it is confirmed that the rare earth element chalcogenide compound according to Example 1 has high conductivity.

Figure 9:
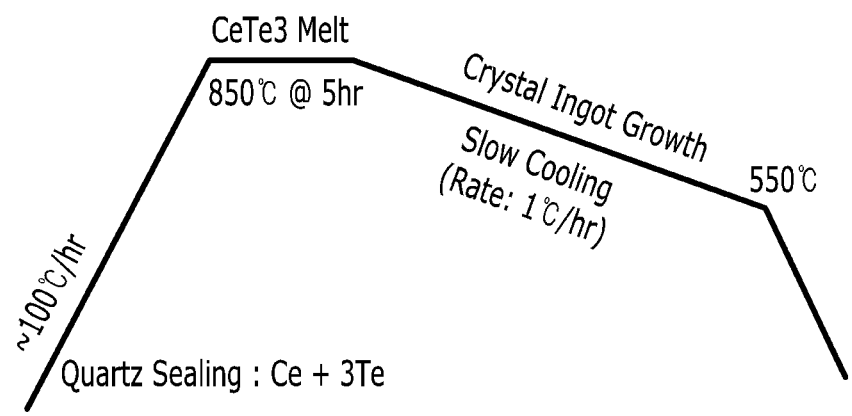
FIG. 9 is a schematic view showing an embodiment of a process of preparing a monocrystal compound according to Example 2.

Example 2: Preparation of Monocrystal 1.40 grams (g) (0.01 mol) of elemental Ce (purity: 99.99%, manufacturer: Sigma Aldrich) and 3.828 g (0.03 mol) of elemental Te (purity: 99.99%, manufacturer: Sigma Aldrich) are combined in a glove box to provide a mixture. The prepared mixture is introduced into a quartz glass tube, and the tube is sealed under a vacuum condition. The quartz glass tube is put into a box furnace and heated to 850° C. at a rate of 100° C./h, and is maintained at this temperature for 5 hours. Then, the temperature of the melted product is decreased to 550° C. at a rate of 1° C./h to grow a crystal ingot including a large grain (200 μm to 1,000 μm). The grown crystal ingot is cooled to room temperature. FIG. 9 shows the temperature profile of the aforementioned process.

The electrical conductivity of the obtained monocrystal is measured using ULVAC-Riko ZEM-3 equipment under the room temperature/normal pressure condition according to the DC 4 terminal method. The results confirm that the electrical conductivity of the monocrystal thus prepared is 9,700 S/cm. The electrical conductivity of the monocrystal is higher than that of the polycrystal sintered body by at least 30%.

Example 3: Preparation of CeTe$_3$ Nanoflakes

The sintered body obtained from Example 1 is mechanically exfoliated to obtain a nanoflake having a thickness of 5 nm. The mechanical exfoliation is performed according to the exfoliation method described in Science 306, 666 (2004) entitled to "Electric Field Effect in Atomically thin carbon films."

Example 4: Manufacture of CeTe$_3$ Thin Film

Pulsed laser deposition (PLD) is conducted on an Al$_2$O$_3$ substrate under the following conditions using the sintered body prepared from Example 1 as a target and using a Nd/YAG laser.
PLD device: PLD 5000 Deposition Systems, PVD Products
Output: 60 milliJoules per square centimeter (mJ/cm$^2$)
Time: 20 min
Substrate temperature: 600° C.
Vacuum degree: 2*10$^{-6}$ Pascals (Pa)
The obtained CeTe$_3$ deposition film has a thickness of about 20 nm.

Example 5: Manufacture of Thin Film Including CeTe$_3$ Nanosheets

The CeTe$_3$ sintered body prepared from Example 1 is pulverized and 0.1 g of the obtained powder is dispersed in 100 ml of hexane including butyllithium dissolved therein, and the resulting dispersion is agitated for 72 hours. A reaction occurs to cause separation between layers, and thereby a dispersion including CeTe$_3$ nanosheets is obtained.

The obtained nanosheets are centrifuged, and the precipitate is washed with water and centrifuged again.

The obtained nanosheet precipitate is placed in a vial. 3 ml of deionized water were added thereto, and the content of the vial is ultrasonicated. 2-3 ml of toluene is further added thereto, and the vial is stirred to provide a thin film including nanosheets at the interface between the aqueous layer and the toluene layer. A glass substrate treated with oxygen plasma is carefully dipped into the interface and immediately pulled up so that a film including the CeTe$_3$ nanosheets present at the interface is spread on the glass substrate.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An electrically conductive thin film, comprising
a compound selected from CeTe$_3$, PrTe$_3$, NdTe$_3$, SmTe$_3$, GdTe$_3$, TbTe$_3$, DyTe$_3$, HoTe$_3$, ErTe$_3$, or a combination thereof, and
wherein the electrically conductive thin film either comprises a plurality of nanosheets of the compound or is a continuous deposition film including the compound,
wherein the electrically conductive thin film has a thickness of less than 5 nanometers,
wherein the electrically conductive thin film has transmittance of greater than or equal to about 90% with respect to light of a wavelength of about 550 nanometers, and
wherein the electrically conductive thin film has an electrical conductivity of greater than or equal to about 3,000 Siemens per centimeter.

2. The electrically conductive thin film of claim 1, wherein the electrically conductive thin film comprises the plurality of the nanosheets and the electrically conductive thin film has a substrate coverage of greater than or equal to about 50%.

3. A transparent electrode comprising an electrically conductive thin film of claim 1 being disposed on a substrate, wherein the substrate comprises a glass, a silicon wafer, Al$_2$O$_3$, or an organic material.

4. The transparent electrode of claim 3, wherein the organic material comprises polycarbonate, polymethyl methacrylate, polyethylene terephthalate, polyethylene naphthalate, polyamide, polyethersulfone, or a combination thereof.

5. The electrically conductive thin film of claim 1, wherein the electrically conductive thin film consists essentially the compound.

6. The electrically conductive thin film of claim 1, wherein a product of absorption coefficient (α) with respect to light of a wavelength of about 550 nanometers at 25° C. and resistivity value (ρ) is less than or equal to about 30 ohm per square.

7. The electrically conductive thin film of claim 1, wherein the layered crystal structure belongs to an orthorhombic system with a Cmcm(63) space group, an orthorhombic system with a C2 cm(40) space group, or a tetragonal system with a P42/n(86) space group.

8. The electrically conductive thin film of claim 1, comprising a monocrystal of the compound.

9. The electrically conductive thin film of claim 1, wherein the nanosheets contact one another to provide an electrical connection.

10. The transparent electrode of claim 3, wherein the electrically conductive thin film is disposed directly on the substrate.

11. The electrically conductive thin film of claim 1, having higher electrical conductivity in an in-plane direction than electrical conductivity in an out-of-plane direction.

12. An electronic device comprising an electrically conductive thin film comprising a compound selected from CeTe$_3$, PrTe$_3$, NdTe$_3$, SmTe$_3$, GdTe$_3$, TbTe$_3$, DyTe$_3$, HoTe$_3$, ErTe$_3$, or a combination thereof,
wherein the electrically conductive thin film either comprises a plurality of nanosheets of the compound or is a continuous deposition film including the compound,
wherein the electrically conductive thin film has a thickness of less than 5 nanometers, wherein the electrically conductive thin film has transmittance of greater than or equal to about 90% with respect to light of a wavelength of about 550 nanometers, and wherein the electrically conductive thin film has an electrical conductivity of greater than or equal to about 3,000 Siemens per centimeter.

13. The electronic device of claim 12, wherein the electrically conductive thin film comprises the plurality of the nanosheets and the electrically conductive thin film has a substrate coverage of greater than or equal to about 50%.

14. The electronic device of claim 12, wherein the electrically conductive thin film has a product of an absorption coefficient ($\alpha$) for light having a wavelength of about 550 nanometers at 25° C. and a resistivity value ($\rho$) thereof of less than or equal to about 30 ohm per square.

15. The electronic device of claim 12, wherein the sheets contact one another to provide an electrical connection.

16. The electronic device of claim 12, wherein the electronic device is a flat panel display, a touch screen panel, a solar cell, an e-window, an electrochromic mirror, a heat mirror, a transparent transistor, or a flexible display.

17. The electronic device of claim 12, wherein the electrically conductive thin film is disposed on a substrate, wherein the substrate comprises a glass, a silicon wafer, $Al_2O_3$, or an organic material and wherein the electrically conductive thin film has a transmittance of greater than or equal to about 90% with respect to light of a wavelength of about 550 nanometers.

18. An electrically conductive thin film, comprising
a compound selected from, $CeTe_3$, $PrTe_3$, $NdTe_3$, $SmTe_3$, $GdTe_3$, $TbTe_3$, $DyTe_3$, $HoTe_3$, $ErTe_3$, or a combination thereof, and wherein the electrically conductive thin film is a continuous deposition film including the compound, wherein the electrically conductive thin film has a thickness of less than 5 nanometers, wherein the electrically conductive thin film has transmittance of greater than or equal to about 90% with respect to light of a wavelength of about 550 nanometers, and wherein the electrically conductive thin film has an electrical conductivity of greater than or equal to about 3,000 Siemens per centimeter.

* * * * *